United States Patent [19]

Buchsbaum

[11] Patent Number: 5,711,889
[45] Date of Patent: Jan. 27, 1998

[54] METHOD FOR MAKING DICHROIC FILTER ARRAY

[76] Inventor: Philip E. Buchsbaum, 4973 Turtle Creek Trail, Oldsmar, Fla. 34677

[21] Appl. No.: 529,113

[22] Filed: Sep. 15, 1995

[51] Int. Cl.$^6$ ............... F21P 5/02; G02B 5/28
[52] U.S. Cl. ............... 216/5; 216/25; 216/39; 216/40
[58] Field of Search ............... 216/24, 25, 39, 216/40, 5; 204/192.31, 192.11

[56] References Cited

U.S. PATENT DOCUMENTS

| | | | |
|---|---|---|---|
| 3,839,039 | 10/1974 | Suzuki et al. | 96/38.3 |
| 3,914,464 | 10/1975 | Thomasson et al. | 427/54 |
| 4,182,647 | 1/1980 | Yoshihara et al. | 430/314 |
| 5,217,832 | 6/1993 | Joslin et al. | 430/7 |

FOREIGN PATENT DOCUMENTS 9404951  3/1994  WIPO .

Primary Examiner—R. Bruce Breneman
Assistant Examiner—George Goudreau
Attorney, Agent, or Firm—Joseph C. Mason, Jr.; Louise A. Foutch

[57] ABSTRACT

A dichroic filter array is mounted on a wafer by combining microelectronic and microlithography techniques. A release layer of copper is evaporated onto a wafer, and the release layer is coated with a photoresist. The assembly is masked, and the unmasked photoresist, after exposure to ultraviolet light, is developed to expose a predetermined section of the release layer. That section of release layer is then overetched to create an undercut in its walls and to expose the underlying wafer. Dichroic filter material is then deposited onto the wafer by a cold process, and the release layer is then removed, leaving only the dichroic filter material on the wafer. The process is repeated to create an array.

12 Claims, 2 Drawing Sheets

METHOD FOR MAKING DICHROIC FILTER ARRAY

BACKGROUND OF THE INVENTION

1. Field of the Invention

This invention relates, generally, to methods for making filter arrays that may be coupled to LCD arrays and used in projection television, virtual reality devices, projection computer media, flat panel displays, VCR view finders, encoders, and the like.

2. Description of the Prior Art

Color-dyed gels positioned in front of LCDs are currently employed to produce color images in miniature TV sets, virtual reality devices, VCR view finders, and numerous other applications.

The gels have a number of shortcomings, however, that limit their utility. For example, they do not function over a wide temperature range and thus cannot meet strict specifications of the type that might be called for in military applications, for example. Moreover, gels absorb relatively high levels of light and thus require more power to produce a desired illumination level than would a less absorptive material. Moreover, the colors are not easily controlled, and the filtering and transmitting of colors is problematic.

It has been recognized by the art that a dichroic filter array would be superior to gels in numerous respects when used in conjunction with LCDs, due to the superior optical qualities of a dichroic filter as compared to that of gels. The colors of a dichroic filter can be controlled to match the CIE chart (1976 UCS standard chromaticity diagram), and such filters enable purer color filtering and transmission due to their higher extinction ratio for each color as compared to gels. They are temperature stable from a range of about –40 degrees to 400 degrees F., and they absorb less than five per cent (5%) of the light transmitted through them. They exhibit a ninety per cent (90%) transmission at each color band and thus require less power to achieve greater brightness.

The industry still uses gels, however, because it has been unable to overcome the manufacturing difficulties encountered in making an array of dichroic filters on a wafer. A typical array includes a plurality of discrete filters arranged in rows and columns on the face of the wafer. The manufacturing of dichroic filter arrays is problematic because it is difficult to manufacture a thin filter unit having sharply defined edges. If a filter unit is too thick, it absorbs too much light and thus requires high power consumption if a good image is to be produced, just like a gel. If the edges are not sharply defined, it produces low quality, hard to control color, just like a gel. These limitations exist in the manufacture of dichroic filter arrays because the art has attempted to make optical filter arrays employing etching techniques that have never been perfected. Thus, although in theory a dichroic filter array should perform better than an array of gels, in practice the thick, poorly defined dichroic filters perform just as poorly.

Several large corporations, including electronic giants such as Sony, have spent millions of dollars over several years trying, without success, to develop arrays of thin, sharply edged dichroic filters on a wafer to replace the gels. However, the efforts have been futile because they are based on refinements of the optical arts. Specifically, the efforts relate to improvements in etching techniques that are designed to reduce the filter thickness and to sharpen the filter edges.

More particularly, in the etching process, the filter material is deposited onto a wafer by an evaporation technique known as "hot process," and a protective film of copper or other suitable material is then deposited atop the filter. A photoresist layer is then deposited atop the copper; the result is a sandwich including, from the top, a layer of photoresist, a layer of protective copper, the filter material, and a wafer. Efforts are then made to etch away the photoresist and the edges of the filter material so that a square or rectangular block of filter material is left on the wafer. The copper layer immediately atop the filter material must also be etched away, but the contiguous copper must be left in place to protect the contiguous filter material when the etching is repeated to form the next block of filter material. Due to the small sizes of the filters (typically, a filter is about 20 microns in width), and since each filter must abut a contiguous filter, the task of producing an array of thin filters with sharply defined edges by conventional etching techniques is nearly impossible, as proven by the years of expensive yet unsuccessful research mentioned above.

At the time the present invention was made, it was not obvious to those of ordinary skill in the art how thin, sharply defined dichroic filters could be applied to wafers.

SUMMARY OF THE INVENTION

The present inventive method produces thin, sharply defined optical color filters on wafers. They produce true, bright colors when illuminated at relatively low power, and the color quality is not lost when the device within which they are used is tilted.

This breakthrough in optical filter array production is made possible by uniting two separate and divergent technologies. The art of microlithography has long been employed to produce microelectronic devices, and the optical arts have long been employed to produce dichroic filter arrays. As mentioned earlier, the optical arts have failed to produce thin filters having well-defined edges, and the art of microlithography has been limited to the field of microelectronics.

The present invention merges the divergent arts of microlithography and microelectronics. A "cold process," well known in the art of microelectronics, is employed to deposit the filter material, in lieu of the conventional "hot process." A releasing agent is applied to the wafer prior to the deposition thereonto of a photoresist, and the release layer is overetched to create an undercut, thereby weakening the walls formed by the photoresist and the unetched releasing agent. The filter material is then deposited onto the wafer in the space created by the etching. The photoresist and releasing agent are then removed, thereby leaving on the wafer a thin optical filter having sharply defined edges.

It is therefore clear that a primary object of this invention is to advance the art of optical filter array manufacture.

A more specific object is to advance said art by providing a method for the manufacture of thin optical color filters having sharply defined edges.

These and other important objects, features, and advantages of the invention will become apparent as this description proceeds.

The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
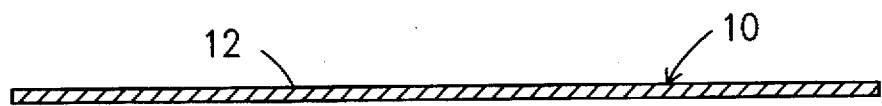
FIG. 1 is the first diagram in an animation that depicts the steps of the novel method.

Referring now to FIG. 1, it will there be seen that the first step in an exemplary embodiment of the invention is denoted as a whole by the reference numeral 10.

The first step includes cleaning a wafer 12 by conventional means; rouge and acetone are typically employed in a well known way.

Figure 2:
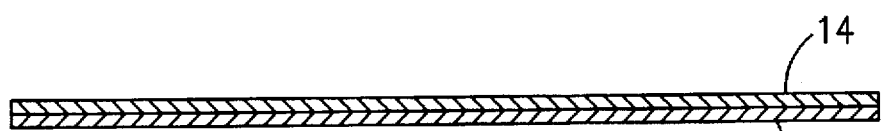
FIG. 2 is the second diagram in the animation.

The second step, depicted in FIG. 2, is performed by applying a releasing agent to wafer 12 by any suitable means to thereby create release layer 14. The preferred releasing agent is copper; chrome and other releasing agents have less efficacy but may be employed. Release layer 14 is preferably evaporated onto wafer 12 by vacuum deposition; the preferred thickness of the release layer is 2–4 thousand angstroms.

Figure 3:
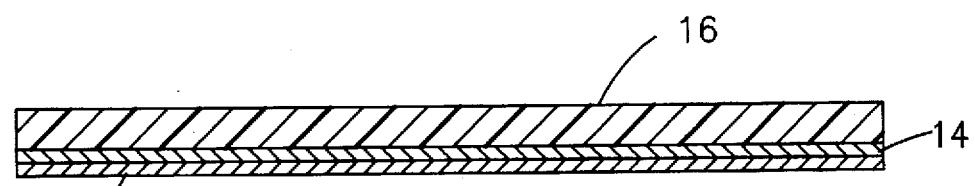
FIG. 3 is the third diagram in the animation.

A suitable photoresist, such as Shipley PR1818, for example, is then applied to release layer 14. In FIG. 3, which depicts the third step of the novel process, the photoresist is denoted by the reference numeral 16; it is about 1.7–1.9 microns in thickness. Photoresist layer 16 is applied to the release layer by a conventional spin technique, well known in the art, and is then baked to remove solvents therefrom in the well-known way.

Figure 4:
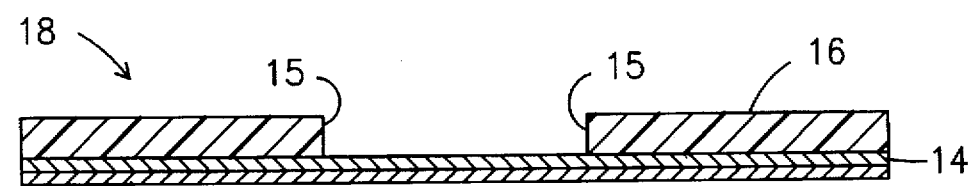
FIG. 4 is the fourth diagram in the animation.

The assembly is then contact or proximity printed to a mask for one of the three primary colors and the unmasked part of the photoresist is exposed to ultraviolet light and developed. The resulting structure is depicted in FIG. 4 and is denoted 18 as a whole; note the photoresist 16 is removed in the area where the optical filter will be positioned. Note further that the edges of the photoresist adjacent the removed part are disposed in a substantially vertical plane, i.e., the edges form ninety degree corners as at 15 with the underlying release layer 14.

Figure 5:
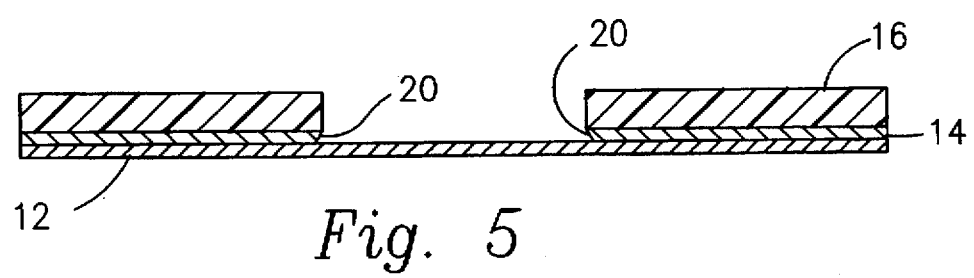
FIG. 5 is the fifth diagram in the animation.

The release layer is then etched in the manner depicted in FIG. 5. It is critical to observe undercut 20 that is formed during this step of the novel method, i.e., the included angle between wafer 12 and release agent 14 is less than ninety degrees as depicted. The undercut is formed by slightly over-etching the release layer with FeCl, ammonium peroxydisulfate, or other suitable etchant. Because of their angle, the resulting walls of the release agent are unstable. In the prior art etching process described above, maintaining stable, perfectly upright walls is considered essential.

Figure 6:
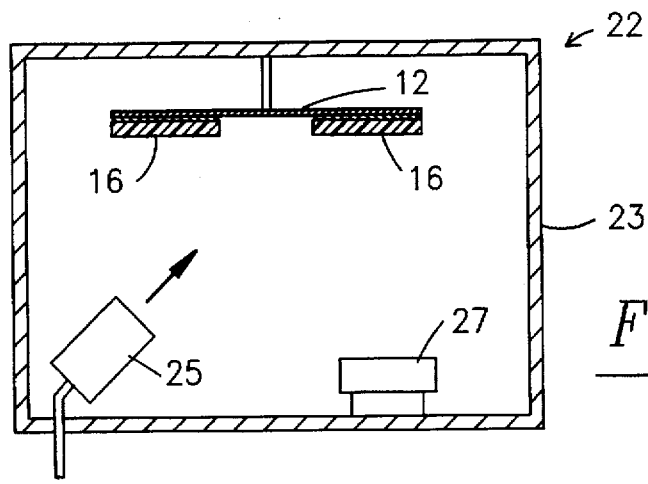
FIG. 6 is the sixth diagram in the animation; it provides a side view, in sectional form, of the assembly positioned in a vacuum coating chamber

The sixth step of the novel process is depicted in FIG. 6 and is denoted 22; the assembly of FIG. 5 is cleaned in a vacuum coating chamber 23 by ion bombardment with argon gas from gun 25; electron gun 27 is used to evaporate material 24. This is a standard cleaning step, well known in the art, for removing residual etchant. This step prepares the assembly of FIG. 5 to receive the filter material.

Figure 7:
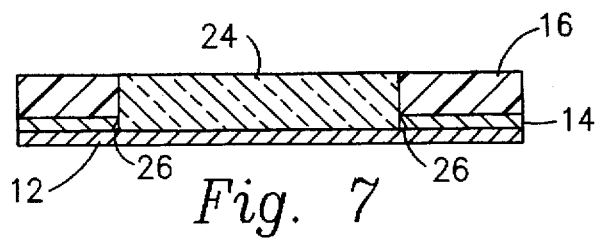
FIG. 7 is the seventh diagram in the animation.

FIG. 7 depicts the assembly after dichroic filter material 24 has been deposited upon the wafer. Significantly, said filter material is evaporated onto the wafer by "cold process." More particularly, material 24 is deposited by alternating non quarterwave high low index stacks of silicone dioxide and titanium dioxide via electron beam deposition with ion assist specific for each color bandpass. Quarterwave high low index stacks are of minimal effectiveness, because they produce a filter that is unacceptably thick. The silicone dioxide is deposited at a rate of about three angstroms per second and the titanium oxide is deposited at a rate of about one angstrom per second. The ion gun should be set at a gas flow of about 18 sccm (standard cubic centimeters per minute). A current of about 1.75 amps and a voltage of about 75 volts should be applied to the anode of the ion gun. The emission rate should be about 2.00 amps. All of these values can vary by about twenty per cent (20% Empirical studies might hereafter determine different ideal settings for the ion gun, and such ideal settings are within the scope of this invention.

It is critical to note the space in FIG. 7 denoted 26; the electron beam deposition described above produces filter material with vertical, i.e., ninety degree walls. Accordingly, there is a gap 26 between such walls and the undercut walls 20 of the release agent 14.

As the process depicted in FIG. 7 is underway, the optical filter material is simultaneously deposited on another substrate to create what is known in the art as a "witness sample." The witness sample is inspected on a spectrophotometer; it is not patterned with images. The data thereby collected is interfaced with a suitable software program designed to interpolate the data to the CIE colormetric scale. A lot traveler is then marked with the observed color coordinates on the CIE chart.

Figure 9:
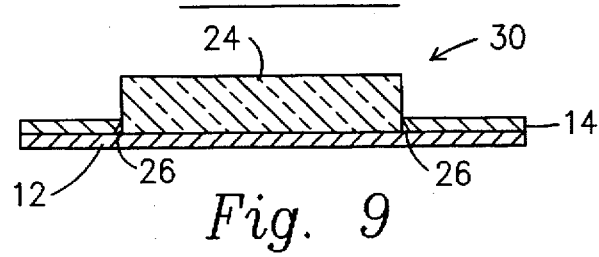
FIG. 9 is the ninth diagram in the animation.

A suitable stripper, i.e., a photoresist remover such as acetone, is then employed to produce the assembly 30 depicted in FIG. 9. Preferably, the wafer is soaked in acetone with agitation; this swells the photoresist 16 and removes it to expose the release layer deposited in the second step of the novel method.

Figure 8:
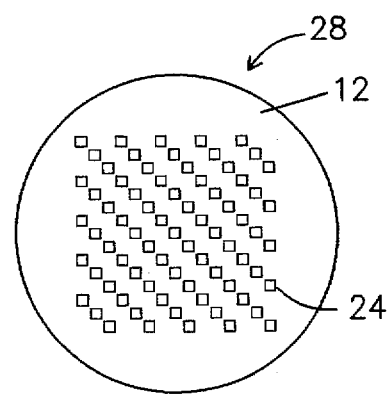
FIG. 8 is the eighth diagram in the animation; it provides a top plan view of the wafer after the step of FIG. 6.
Figure 10:
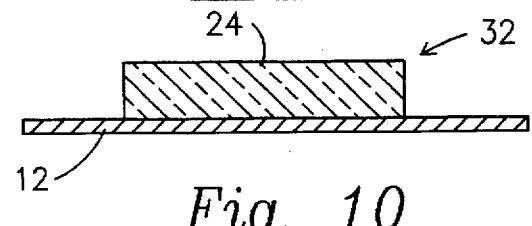
FIG. 10 is the tenth diagram in the animation.
Figure 12:
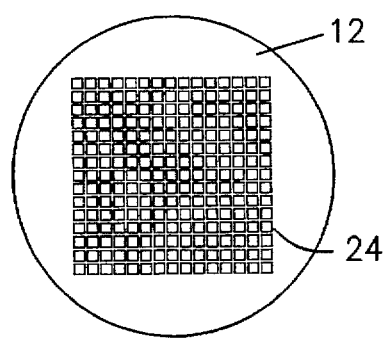
FIG. 12 is a top plan view of the finished wafer.

Release layer 14 is then removed in a conventional manner with a suitable etchant such as ferric chloride (FeCl), i.e., in the same manner as performed in the fifth step of the novel method. The resulting structure of one item of filter material is depicted in FIG. 10 as at 32, and in FIG. 8 as 24. It should be understood that a plurality of filter material members 24, all having a common color, are manufactured simultaneously by following the steps disclosed herein. As FIG. 8, after all of the filter material members 24 of a first color have been deposited onto wafer 12, in spaced apart relation to one another as indicated in FIG. 8, the spaces are then filled by repeating the novel process a second time with filter material 24 of a second color, and by then repeating the novel process a third time with a third color. Thus, FIG. 12 depicts a finished wafer.

Note the sharply defined edges of the optical filter 24. Just as importantly, filter material 24 has a thickness of approximately 1.4 microns, i.e., about one-fourth as thick as conventionally manufactured filters. It is virtually impossible to produce a filter having such sharply defined edges when following the steps of the conventional etching method described earlier.

Figure 11:
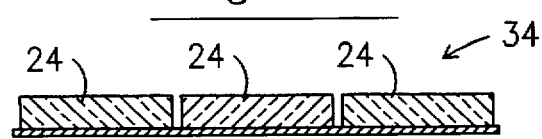
FIG. 11 is the eleventh diagram in the animation.

The filter unit depicted in FIG. 10 will have a blue, red, or green color and when the novel process is finished, will be flanked by similar units of filters having one of said primary colors. FIG. 11 depicts a three color matrix 34. Significantly, it is a simple matter to construct additional dichroic filter units 24 contiguous to the unit first manufactured by following the steps disclosed above. Each unit will have sharply defined edges and uniform thickness. The size of each dichroic filter, the spacing between the filters, the overall design of the array, and other parameters may be easily changed to meet customer specifications. FIG. 12 depicts a finished wafer as aforesaid.

The implications of this breakthrough technology are significant, and it has numerous applications. For example, current technology limits to a single frequency the frequency at which encoders may be switched on and off. A dichroic filter array made in accordance with this disclosure, however, would enable multiple frequency on/off switching. Such application could have implications as far reaching as the flat screen applications for this invention.

It will thus be seen that the objects set forth above, and those made apparent from the foregoing description, are efficiently attained. Since certain changes may be made in the foregoing construction without departing from the scope of the invention, it is intended that all matters contained in the foregoing construction or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method for manufacturing a dichroic filter array on a wafer, comprising the steps of:

applying a releasing agent to a clean wafer to form a release layer;

applying a photoresist to said release layer;

masking preselected areas of the photoresist;

developing unmasked areas of the photoresist to create a preselected space where the release layer is exposed;

over-etching the release layer to form an undercut in said release layer and to expose a predetermined section of the wafer;

depositing dichroic filter material on said predetermined section of the wafer;

removing the photoresist to expose the release layer; removing the release layer; and repeating the foregoing steps to deposit a predetermined number of dichroic filters on said wafer in a predetermined array.

2. The method of claim 1, wherein said release layer is applied to said wafer by vacuum deposition until said release layer has a thickness of about 2–4 thousand angstroms.

3. The method of claim 2, wherein said photoresist is applied to the release layer until said photoresist has a thickness of about 1.0–1.2 microns, and said photoresist is baked to remove solvents therefrom.

4. The method of claim 3, wherein the masking of the photoresist is performed by contact printing.

5. The method of claim 3, wherein the masking of the photoresist is performed by proximity printing.

6. The method of claim 1, further comprising the step of cleaning the wafer after said step of over-etching.

7. The method of claim 6, wherein the step of cleaning said wafer is performed by placing it in a vacuum coating chamber and ion bombarding said wafer with argon.

8. The method of claim 1, wherein the dichroic filter material is deposited onto said wafer by employing electron beam deposition with ion assist specific for a preselected color bandpass.

9. The method of claim 8, wherein the electron beam deposition with ion assist deposits alternating nonquarter-wave high low index stacks of silicone dioxide and titanium dioxide onto said wafer.

10. The method of claim 9, wherein the silicone dioxide is deposited at a rate of one angstrom per second and the titanium dioxide is deposited at a rate of three angstroms per second.

11. The method of claim 1, further comprising the steps of:

creating a witness sample when the dichroic filter material is being deposited to said wafer, inspecting the witness sample on a spectrophotometer, determining the color coordinates of the witness sample, and marking a lot traveler with said observed color coordinates.

12. The method of claim 1, further comprising the step of removing the exposed release layer after the photoresist has been removed therefrom.

* * * * *